United States Patent [19]

DeBortoli

[11] Patent Number: 4,497,411
[45] Date of Patent: Feb. 5, 1985

[54] DISTRIBUTING FRAME FOR TELECOMMUNICATIONS SYSTEMS

[75] Inventor: George DeBortoli, Ottawa, Canada

[73] Assignee: Northern Telecom Limited, Montreal, Canada

[21] Appl. No.: 369,342

[22] Filed: Apr. 19, 1982

[51] Int. Cl.³ .................................................. A47F 5/00
[52] U.S. Cl. ...................................... 211/26; 211/189; 361/415; 361/429
[58] Field of Search .................. 211/26, 41, 189, 186, 211/187, 126, 129, 133, 193, 134; 339/198 R; 361/415, 334, 391, 429, 393, 394

[56] References Cited

U.S. PATENT DOCUMENTS

| | | | |
|---|---|---|---|
| 2,480,568 | 8/1949 | Garvin | 361/334 |
| 3,378,320 | 4/1968 | Morgan et al. | 361/334 X |
| 3,716,760 | 2/1973 | Bertellotti et al. | 361/415 |
| 3,872,971 | 3/1975 | Dinsmore et al. | 211/13 |
| 4,131,934 | 12/1978 | Becker et al. | 361/415 X |
| 4,158,754 | 6/1979 | Yonezaki et al. | 361/429 X |
| 4,288,838 | 9/1981 | Van Der Vegte et al. | 361/415 X |
| 4,305,114 | 12/1981 | Takagi et al. | 361/334 X |

Primary Examiner—Robert W. Gibson, Jr.
Attorney, Agent, or Firm—Sidney T. Jelly

[57] ABSTRACT

A distributing frame, for telecommunications systems, comprises an upright hollow member, on the front of which are mounted a number of shelf members, spaced vertically, one above the other. Modules, containing connectors are mounted on the fronts of the shelf members, usually in pairs, a pair on each shelf member, the modules side-by-side. Further modules are mounted on the back of the hollow member, again usually in vertically spaced pairs. Access to the modules is provided from the interior of the hollow member. A number of such frames can be mounted side-by-side and the tops of the shelf members form continuous shelves for carrying conductors. In an arrangement of a plurality of frames side-by-side, the front is referred to as the horizontal side, while the back is referred to as the vertical side.

12 Claims, 10 Drawing Figures

DISTRIBUTING FRAME FOR TELECOMMUNICATIONS SYSTEMS

This invention relates to distributing frames, for telecommunications systems, and is particularly concerned with providing a distributing frame providing termination and cross-connect facilities for telephone switching centers, customer premises such as commercial industrial and institutional buildings or multi-residential buildings.

U.S. Pat. No. 4,278,315, issued on July 14th, 1981 to the present assignee, describes a module, or mounting member, on which are mounted a plurality of connectors, each connector having a plurality of terminals, typical connectors being described in U.S. Pat. No. 4,295,703, issued Oct. 20th, 1981, to the present assignee. It was proposed that the modules be mounted on a flat surface, such as a wall, modules being spaced vertically, and laterally, as required.

The present invention provides a distributing frame on which modules, or mounting members, can be mounted on either side, that is front and back. Such a frame considerably increases the terminating capacity and flexibility as it is free standing, that is not wall mounted and is in modular sections butted together in an accumulative lineup. The invention also provides an arrangement optimum wire distribution capability and also which is cheaper to manufacture than many conventional arrangements.

A distributing frame, in accordance with the present invention, comprises a vertical, upright hollow member having a front and a back; a plurality of hollow shelf members mounted on said front, one above the other with access from the hollow member to said shelf members; means for attaching modules on the front face of the shelf members, and means for attaching modules on the back, with access from the hollow member to said modules; said shelf members having apertures in back and front faces, whereby access is available from the interior of said vertical hollow member to said modules mounted on said shelf members. In a particular arrangement, modules are attached side-by-side, in pairs, the panel back and the front faces of the shelf members having pairs of apertures, an aperture aligned with each module.

Frames can be mounted side-by-side, with the shelf members abutting to form horizontal shelf units. Distribution rings may be mounted on each shelf member, and on the sides of each vertical hollow member, for retention of conductors in cross-connections.

The invention will be readily understood by the following description of one embodiment, by way of example, in conjunction with the accompanying drawings, in which:

(FIG. 1, assembled and with modules).

Figure 1:
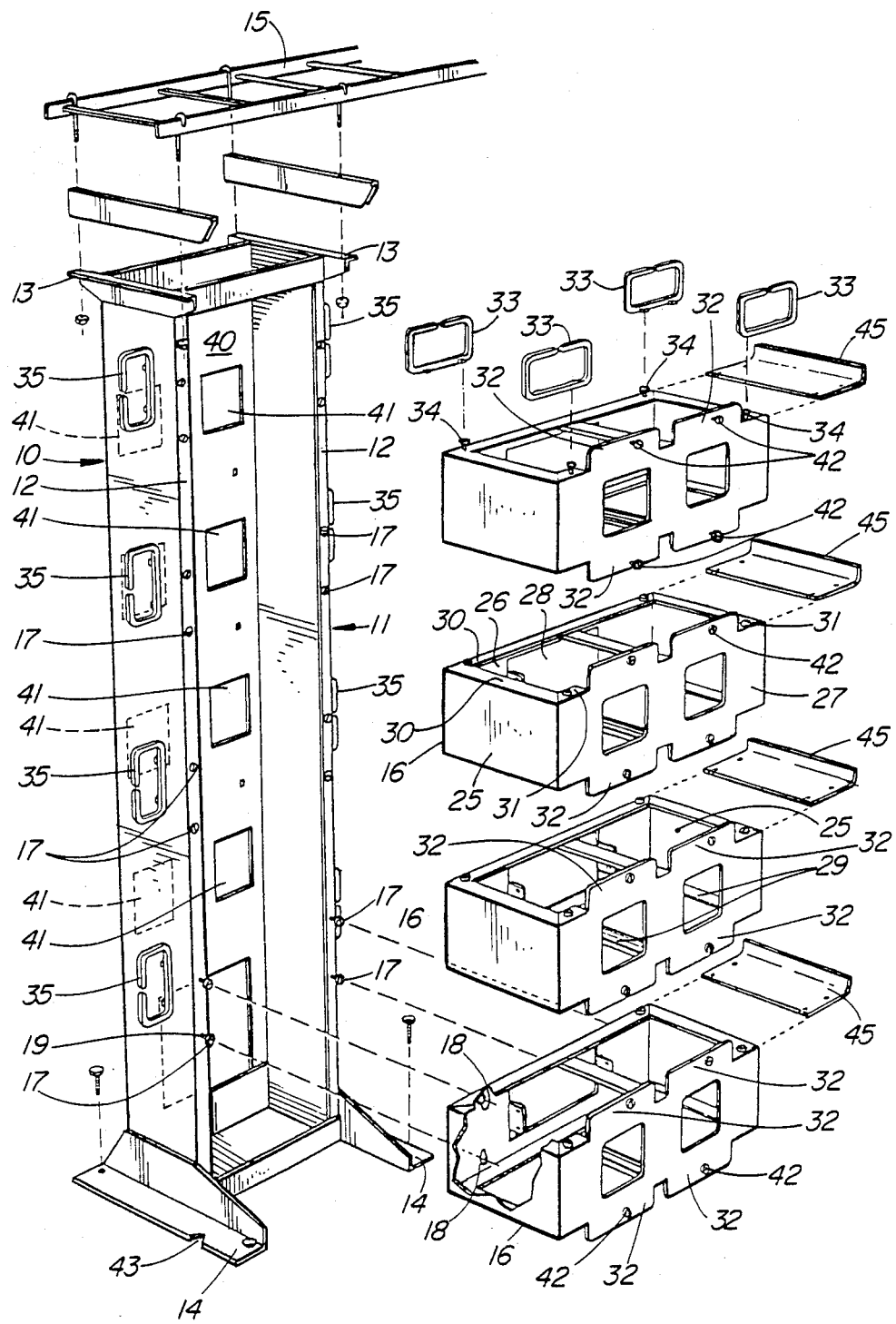
FIG. 1 is an exploded perspective view of one distributing frame.

As illustrated in FIG. 1, a distributing frame comprises a hollow upright or vertical member 10, having an open front 11, with inturned edges 12. Angle members 13 and 14 at top and bottom respectively, provide for attachment of a cable rack 15 and for mounting the vertical member 10 on a floor, or other substructure.

On the open front, a plurality of shelf members 16 are mounted, or attached. The shelf members are attached by screws 17 passing through holes 18 in the back of a shelf member and screwing into threaded holes 19 in the inturned edges 12.

Each shelf member 16 is of a box-like formation having ends 25, back 26 and front 27. In the back 26 is a large aperture 28 and in the front are two apertures 29, although a single large aperture can also be provided in the front. The top and bottom edges of the sides 25 and back 26 are inturned, at 30. Portions 31 of the top and bottom edges of the front 27 are also inturned, but the major portions 32 of the top and bottom edges of the front 27 extend up and down beyond the top and bottom surfaces of the shelf member.

Distribution rings 33 attach to the top surface of each shelf member, at each corner, being mounted on the top inturned edges 30 by screws 34. Further distribution rings 35 are mounted on each side of the vertical member 10.

The back of the vertical member 10 is in the form of a panel 40. In this panel are formed a plurality of apertures 41. In the example, the apertures are in pairs spaced vertically. Apertures 41 are spaced closer together vertically than apertures 29.

Figure 9:
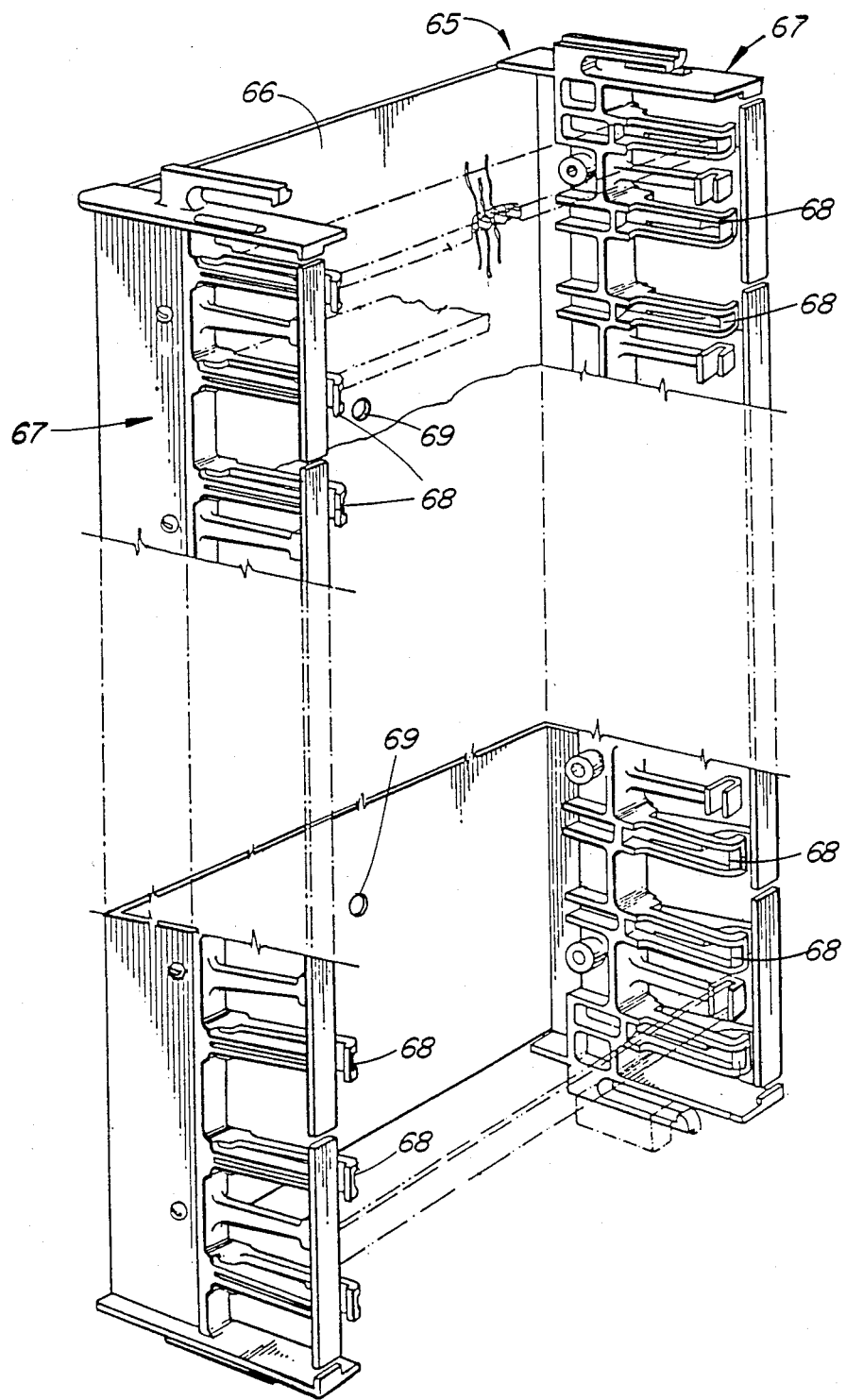
FIG. 9 is a perspective view of one form of module to the frame.

A module, not shown in FIG. 1, is mounted in alignment with each aperture 29 and each aperture 41. That is a pair of modules are mounted on the front of each shelf member 16, using the screws 42. Similarly pairs of modules are mounted on the outside of the panel 40. A typical form of module is illustrated in FIG. 9 and will be described briefly later. While, in FIG. 1, the member 10 is shown as having an open front and a panel back, this can be varied, the requirement being that access be provided from the interior of the member 10 to the modules.

Figure 2:
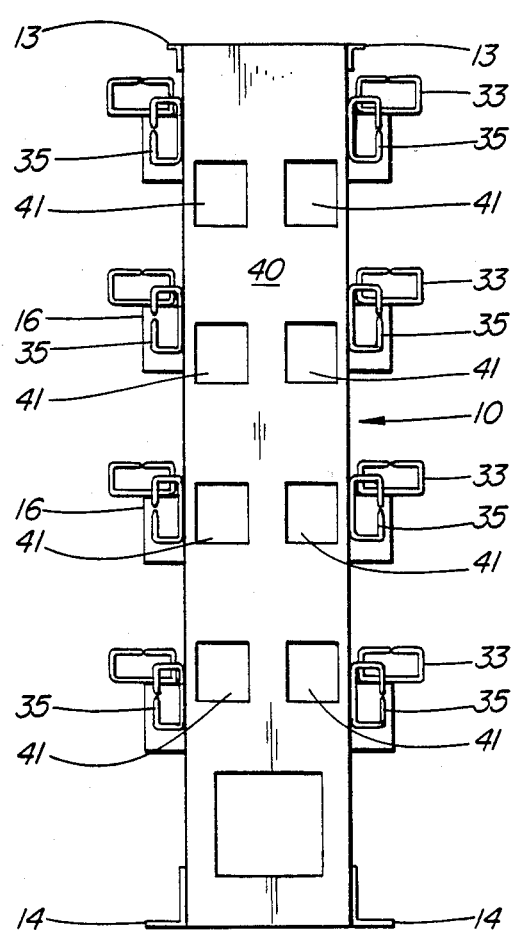
FIGS. 2 and 3 are back and side views of an assembled frame as in FIG. 1.
Figure 3:
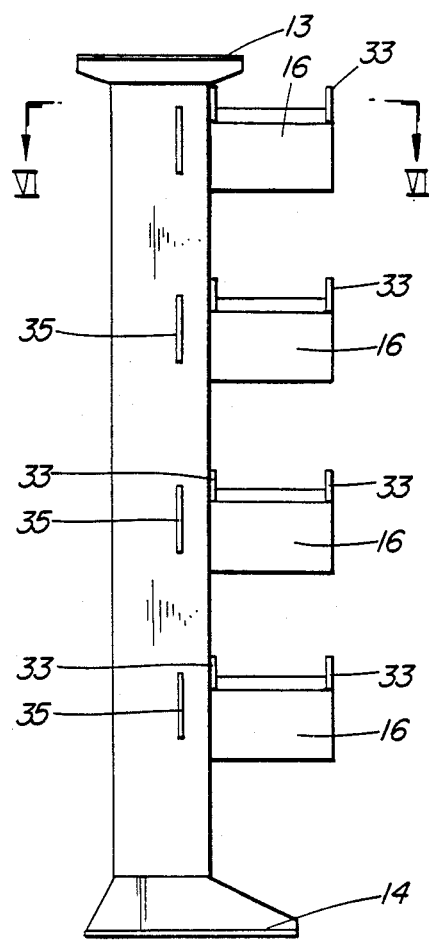
Figure 4:
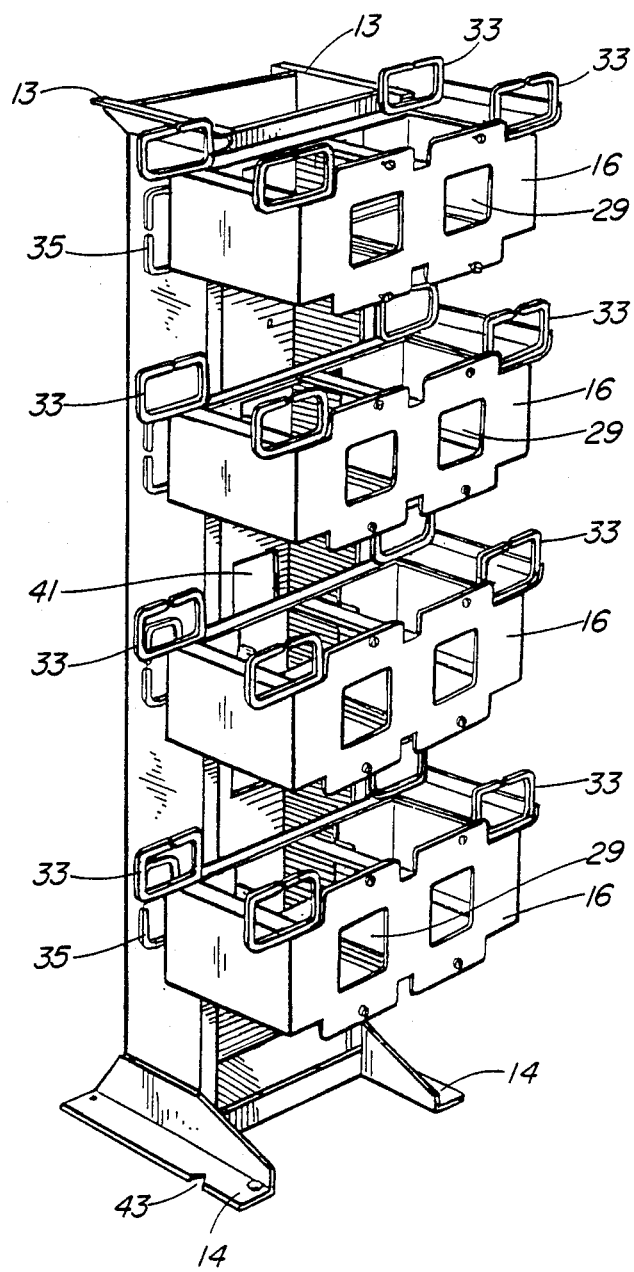
FIG. 4 is a perspective front view of the frame of FIGS. 2 and 3.
Figure 5:
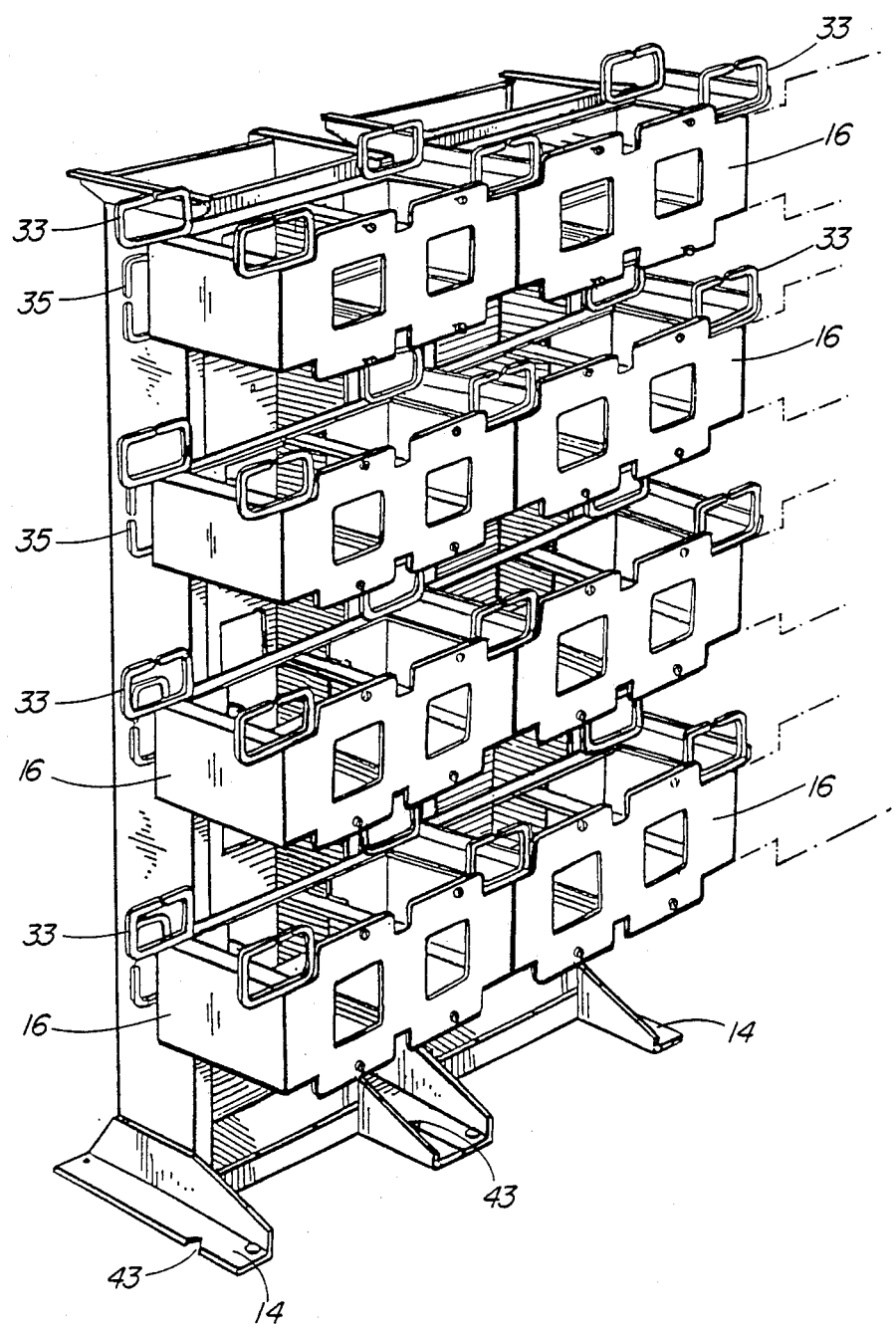
FIG. 5 is a perspective front view of a plurality of frames, as in FIG. 4, assembled side-by-side.

FIGS. 2, 3 and 4 are various views of a frame assembled, the shelf members 16 attached, but without modules. Individual frames can be positioned side-by-side to form a long array or frame assembly. The individual frames are mounted on the floor, or other substructure. To assist in alignment a Vee notch 43 is formed in each bottom angle member 14. By drawing a line on the floor, the frames can be aligned with each other and with any part of a building, quite readily. When several frames are positioned side-by-side, the distribution rings 33 on alternate frames are not required, as the rings 33 span the junction between two frames, each ring being attached to two shelf members, one on each frame. Guard members 45 are provided to attach at one end of a shelf member (see FIG. 1). A guard member is only attached at the extreme end of a row of frames, if several frames are mounted side-by-side. FIG. 5 illustrates two frames assembled side-by-side, with rings 33 spanning adjacent shelf members, and guard members 45 at each end. The shelf members are in substantially abutting relationship.

Figures 6, 7, 8:
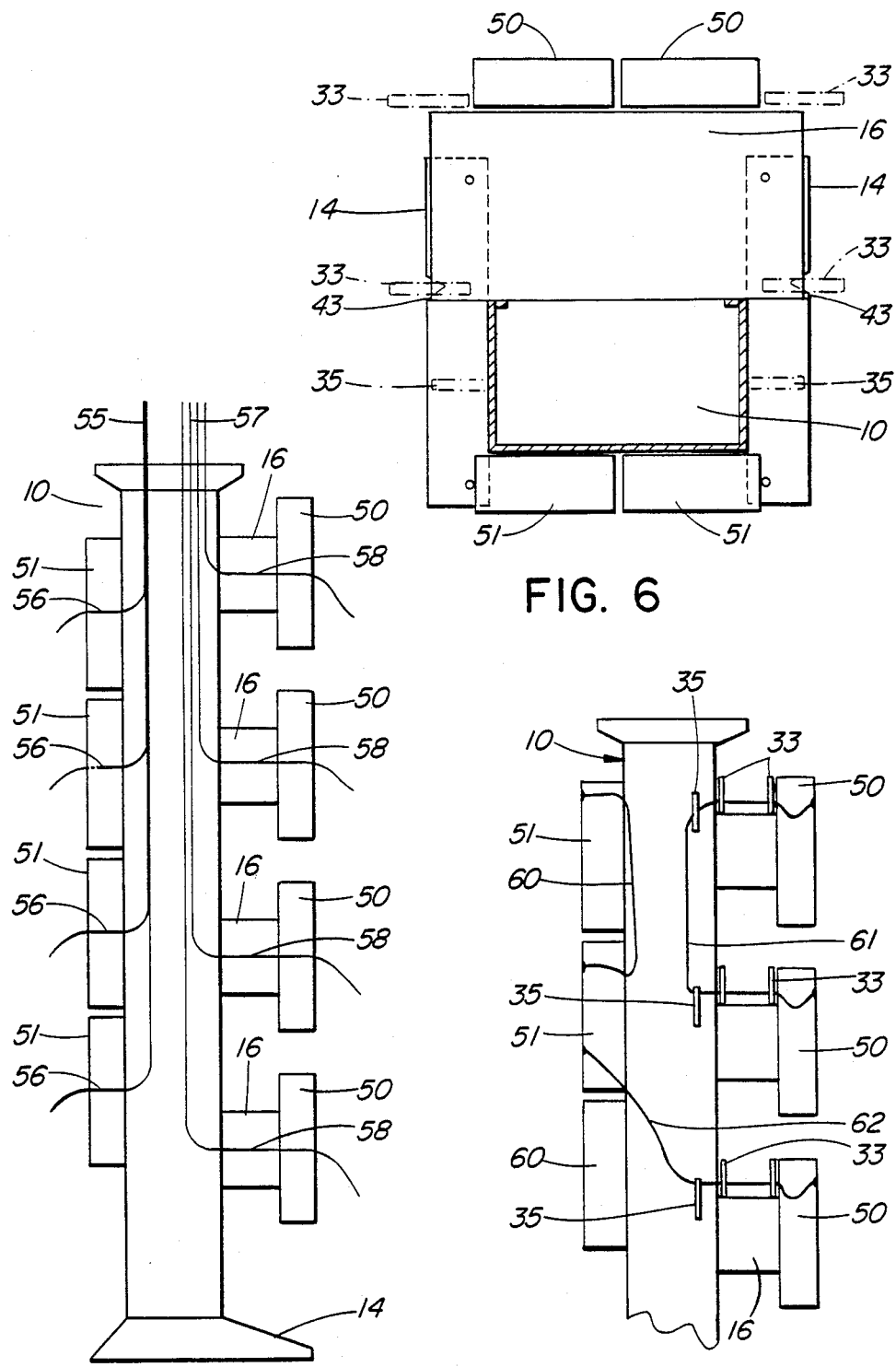
FIG. 6 is a diagrammatic cross-section as on the line VI—VI of FIG. 3, with modules attached.
FIGS. 7 and 8 are diagrammatic side views illustrating conductor paths in the frame, FIG. 7 for incoming and outgoing cables and FIG. 8 for cross-connections.

FIG. 6 is a very diagrammatic cross-section illustrating the vertical member 10, a shelf member 16, two modules or connectors 50 attached to the front face of the shelf member, and two modules or connectors 51 attached to the back of the vertical member 10. The modules 50 and 51 are usually of the same form. The distributing rings 33 and 35 have been omitted, FIG. 6 being intended to illustrate the relative positioning of the modules 50 and 51, in a plan view.

FIGS. 7 and 8 illustrate, also very diagrammatically, the path of cables, in FIG. 7, and various forms of cross-connection between modules, in FIG. 8.

It will be seen that, with a plurality of frames positioned side-by-side, the shelf members 16 will form substantially continuous horizontal rows, with modules 50 extending spaced apart along each row. The modules 50 are thus referred to as the horizontal side. The modules 51 are closer together vertically, than modules 50, as seen in FIGS. 7 and 8. They thus form vertical rows and this is referred to as the vertical side.

Considering first FIG. 7, a first cable, or plurality of cables, enters at the top, being indicated at 55. For example this may be a cable, or cables, incoming from subscribers. The conductors in the cable are subdivided into bundles, indicated at 56, and the individual conductors connected to the rear ends of terminals in the modules 51.

A second cable, or plurality of cables, indicated at 57, enters at the top. This cable, or cables, for example connect to switching apparatus. Again the conductors are divided into bundles, unless the cables are small enough, indicated at 58, and the individual conductors connected to the rear ends of terminals in the modules 50.

In an alternative arrangement, cable or cables 55 may connect to the switching apparatus and cable or cables 57 are outgoing to subscribers.

Cross connections can be made vertical to vertical, horizontal to horizontal, or vertical to horizontal and vice-versa. These are illustrated in FIG. 8, vertical to vertical at 60, horizontal to horizontal at 61 and vertical to horizontal at 62. It will be seen that the distributing rings 33 and 35 are used to contain conductors distributed from horizontal to horizontal and vertical to horizontal connections.

For the vertical side, the number of conductors associated with a vertical row of connectors or modules 51 is limited to the terminating capacity of the modules within that vertical. Cross-connections seldom occur between modules in a vertical row, but usually transverse to the horizontal side. Thus the modules are mounted directly on the vertical member. For the horizontal rows, as interconnects can occur between any module in a horizontal row, which can be long, or between any module in a vertical row and any module in a horizontal row, the shelf member is provided to provide sufficient room to carry all the conductors.

As, a particular example, there are 250 pairs of conductors per module and thus vertical interconnections have a maximum of a 1000 pairs. With several frames side-by-side, there can be a total terminating capacity of 40,000 pairs, and it is arranged that any horizontal run of conductors is along the horizontal side, using the shelf members. However this is exemplary only. The capacity of the system can be increased in various ways. For example the height of the frame can be increased and more shelves added on the horizontal side and correspondingly increasing the number of module mountings on the vertical side. This gives a higher terminating capacity frame. The upright member 10 is provided with a plurality of shelf mounting holes to provide flexibility in number of shelves, and similarly for the number of modules on the back. The conductor handling capacity of a distributing frame is related to the shelf capacity, ie., the number of conductors which can be placed on a shelf. Varying the shelf dimensions, that is the front to back dimension, varies the capacity, increase or decrease. Various sizes of shelf can be provided to give a desired capacity. The capacity of a shelf is also related to the conductor diameter, conductor packing density and the type of conductor assignment on the frame.

It will be noted that the arrangement separates cable pairs from cross-connection pairs, the cable pairs being contained within the vertical member, and shelf members, while the cross-connection pairs are contained on outer sides of the vertical members and on the shelf members.

Figure 10:
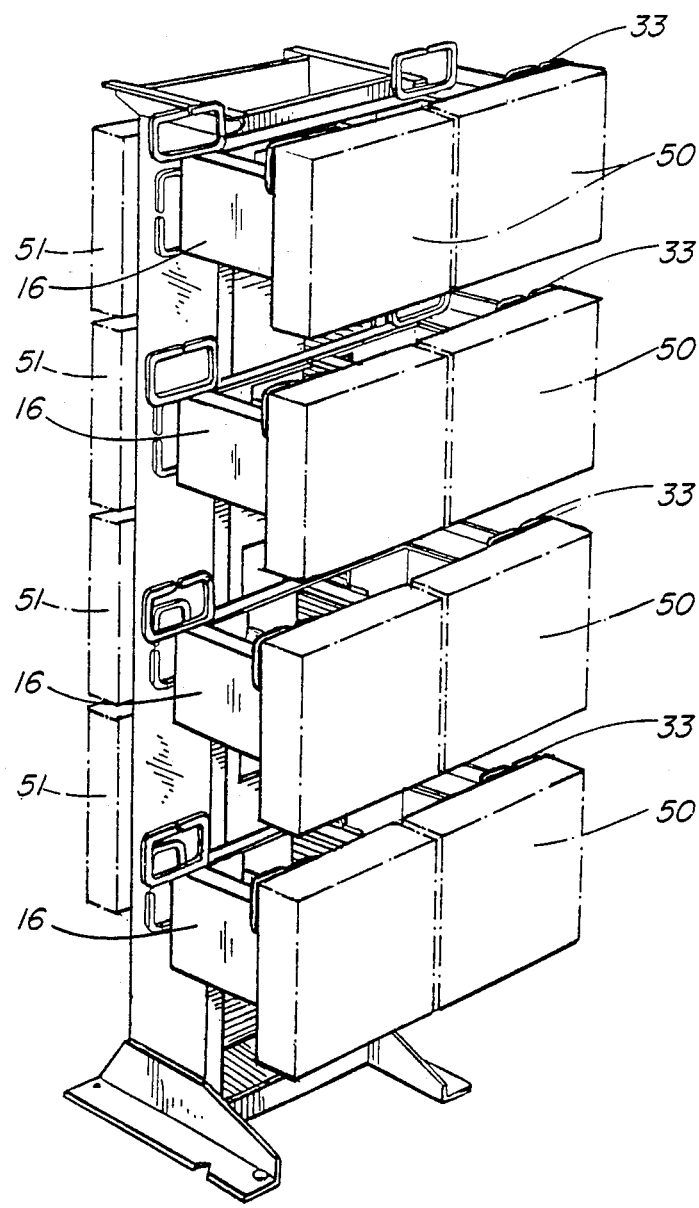
FIG. 10 is a perspective view showing modules attached to the frame.

FIG. 9 illustrates one form of module which can be mounted on the shelf members 16 and vertical member 10. The module in FIG. 9 is indicated generally at 65, but can be used for the modules indicated at 50 and 51 in FIGS. 6, 7 and 8. This module is described in detail in U.S. Pat. No. 4,278,315. The module has a back 66 and fanning members or strips 67 extending down each side edge. The fanning strips 67 serve to position conductors and also support connectors which extend across the module from one side to the other. The connector blocks (not shown in FIG. 9) slide into cantilever members 68 formed as parts of the forming strips 67. Holes 69 in the back 66 permit passage of the screws 42 (FIG. 1) for mounting on the front 27 of a shelf member 16, and for screws (not shown) for mounting of the module on the outside of the panel 40. FIG. 10 illustrates an assembled frame with modules 50 mounted on shelf members 16 and modules 51 mounted on the back.

The form of the modules 65 can of course vary. Similarly, the form of the connectors which are mounted on the module can vary. One particular form is described in U.S. Pat. No. 4,295,703. The disclosures of U.S. Pat. Nos. 4,278,315 and 4,295,703 are specifically included herein.

The distributing frame is compact, with high termination density, low weight, uses common modules for both sides and segregates cable conductors from cross-connection conductors. It is easy to handle and install.

What is claimed is:

1. A distributing frame comprising:
an upright hollow member having a front and a back;
a plurality of hollow shelf members mounted on said front, one above the other, with access from said hollow member through said front to said shelf members;
each of said shelf members including an aperture in a back wall and at least one aperture in a front wall;
means for attaching modules on said front wall of each of said shelf members, with access to the modules from said shelf members through said apertures in said front walls;
means for attaching modules on said back, one above the other, with access from said hollow member through said back to the modules attached to said back.

2. A distributing frame as claimed in claim 1, said means for attaching modules on the front wall of each shelf member being arranged to attach two modules side-by-side.

3. A distributing frame comprising:
an upright hollow member having an open front and a panel back and a plurality of apertures in said back to provide access therethrough;
a plurality of hollow shelf members mounted on said front, one above the other, with access from said hollow member through said front to said shelf members;
means for attaching modules on a front wall of said shelf members, with access to the modules from said shelf members;
means for attaching modules on said back, one above the other, with access from said hollow member through said apertures in said back to modules attached to said back.

4. A distributing frame as claimed in claim 3, said means for attaching said modules on the back of said hollow member being arranged to attach two modules side-by-side on said back.

5. A distributing frame as claimed in claim 3, said plurality of apertures positioned in pairs spaced vertically, said means for attaching modules on the back of said hollow member being arranged to attach two modules side-by-side in pairs spaced vertically, a module associated with each aperture.

6. A distributing frame as claimed in claim 3, said open front having inturned edges for attachment of said shelf members.

7. A distributing frame as claimed in claim 3, each said shelf member being of box-like formation.

8. A distributing frame as claimed in claim 3, said upright hollow member having a top and bottom, and means for attaching a cable rack at said top.

9. A distributing frame as claimed in claim 8, including angle members at said top and bottom, said angle members extend along sides of said hollow member, said angle members at the top providing said means for attaching said cable rack, said angle members at said bottom providing means for mounting said hollow member on a floor.

10. A distributing frame as claimed in claim 3, including distribution rings at each end of each said shelf member, on a top surface thereof.

11. A distributing frame as claimed in claim 3, including distribution rings on each side of the upright hollow member.

12. A distribution frame assembly comprising a plurality of distributing frames as claimed in claim 3, mounted side-by-side to form a continuous unit.

* * * * *